United States Patent
Ogashiwa et al.

(10) Patent No.: US 9,065,418 B2
(45) Date of Patent: Jun. 23, 2015

(54) RESONATOR ELECTRODE MATERIAL EXCELLENT IN AGING PROPERTY, PIEZOELECTRIC RESONATOR USING THE SAME MATERIAL, AND SPUTTERING TARGET MADE OF THE SAME MATERIAL

(75) Inventors: Toshinori Ogashiwa, Hiratsuka (JP); Masaaki Kurita, Hiratsuka (JP); Takashi Terui, Tomioka (JP); Takeyuki Sagae, Tokyo (JP); Katsunori Akane, Sayama (JP); Kenzo Okamoto, Sayama (JP); Kenichi Ueki, Sayama (JP); Shohei Takeda, Sayama (JP)

(73) Assignees: Nihon Dempa Kogyo Co. Ltd., Tokyo (JP); Tanaka Kikinzoko Kogyo K.K., Tokyo (JP)

( * ) Notice: Subject to any disclaimer, the term of this patent is extended or adjusted under 35 U.S.C. 154(b) by 478 days.

(21) Appl. No.: 13/516,365

(22) PCT Filed: Apr. 28, 2010

(86) PCT No.: PCT/JP2010/057606
§ 371 (c)(1),
(2), (4) Date: Jun. 15, 2012

(87) PCT Pub. No.: WO2011/077766
PCT Pub. Date: Jun. 30, 2011

(65) Prior Publication Data
US 2012/0248943 A1    Oct. 4, 2012

(30) Foreign Application Priority Data

Dec. 25, 2009  (JP) ................................. 2009-295350

(51) Int. Cl.
| | | |
|---|---|---|
| H01L 41/047 | (2006.01) |
| H03H 9/05 | (2006.01) |
| H03H 9/10 | (2006.01) |
| H03H 9/13 | (2006.01) |

(52) U.S. Cl.
CPC ........... *H03H 9/0547* (2013.01); *H03H 9/1021* (2013.01); *H03H 9/132* (2013.01)

(58) Field of Classification Search
CPC ..... H03H 9/121; H03H 9/02929; H03H 3/02; H03H 3/08
USPC ........................................................ 310/363
See application file for complete search history.

(56) References Cited

U.S. PATENT DOCUMENTS

| 5,427,672 A | * 6/1995 | Bocker et al. .................. 204/426 |
| 6,525,449 B1 | 2/2003 | Wajima ........................ 310/365 |
| 2004/0238356 A1 | 12/2004 | Matsuzaki et al. ....... 204/298.13 |

FOREIGN PATENT DOCUMENTS

| JP | 5-95075 | * 4/1993 | .................... 257/690 |
| JP | 11-168343 | 6/1999 | |

(Continued)

*Primary Examiner* — Thomas Dougherty
(74) *Attorney, Agent, or Firm* — Roberts & Roberts, LLP

(57) ABSTRACT

An electrode material capable of making more satisfactory the dispersion at the time of production and the aging property of a resonator than Au and capable of reducing the price as compared to Au. An resonator electrode material including a ternary alloy composed of Au and two metals M1 and M2, and being used as an excitation electrode to excite oscillation in a piezoelectric element, wherein the two metals M1 and M2 are, respectively, (a) metal M1: a metal exhibiting a tendency to decrease the temporal frequency property (Δf1/f1) from the reference value f1, and (b) metal M2: a metal exhibiting a tendency to increase the temporal frequency property (Δf1/f1) from the reference value f1. The metal M1 is preferably at least any one of Ag, Al and Ni, and the metal M2 is preferably at least any one of Pd, Ru, Pt, Ir, Rh and Cu.

18 Claims, 6 Drawing Sheets

(56) References Cited

FOREIGN PATENT DOCUMENTS

| | | |
|---|---|---|
| JP | 2002-141242 | 5/2002 |
| JP | 2004-84065 | 3/2004 |
| JP | 2005-236360 | 9/2005 |
| JP | 2006-157509 | 6/2006 |
| JP | 2008-42873 | 2/2008 |

* cited by examiner (a)

(b)

(a)

(b)

RESONATOR ELECTRODE MATERIAL EXCELLENT IN AGING PROPERTY, PIEZOELECTRIC RESONATOR USING THE SAME MATERIAL, AND SPUTTERING TARGET MADE OF THE SAME MATERIAL

TECHNICAL FIELD

The present invention relates to a resonator electrode material for a quartz crystal resonator and the like, as applied as an excitation electrode, in particular to a resonator electrode material making satisfactory the dispersion at the time of the production of a piezoelectric resonator and the aging property (temporal frequency property) of a piezoelectric resonator and moreover being inexpensive. The present invention also relates to a piezoelectric resonator using the resonator electrode material and a sputtering target suitable for forming the electrode of the piezoelectric resonator.

DESCRIPTION OF THE RELATED ART

The piezoelectric resonator, in particular, the quartz crystal resonator is well known as a frequency control element, and is built in as a frequency time reference for various electronic devices. Recently, such an oscillator has become an indispensable part for consumer digital control devices and the demand for such an oscillator has been monotonically increasing, and accordingly, price reduction combined with further improvement of the quality has been demanded.

FIG. 4 shows a configuration of a surface mounting-type quartz crystal resonator, an example of a quartz crystal resonator. The quartz crystal resonator includes a case body 1 made of a laminate ceramic, a quartz crystal element 2 housed in the case body 1, and a metallic cover 3 covering the case to hermetically encapsulate the quartz crystal element 2. A quartz crystal holding terminal 4 is placed on the inner bottom face of the case body 1, and mounting terminals 5 are placed at the four corners of the outer bottom face of the case body 1. The metallic cover 3 is joined by seam welding to a not-shown metal ring disposed on the open end face of the case body 1. The quartz crystal holding terminal 4 is electrically connected to a pair of the diagonal mounting terminals 5, and the metallic cover 3 is electrically connected to the other pair of the diagonal mounting terminals 5, respectively through an electrically-conducting path including a penetrating electrode.

The quartz crystal element 2 is an element prepared, for example, as follows: a quartz wafer is cut out from an artificial quartz; the quartz wafer is subjected to grinding and cutting processing to result in individually divided elements each having a rectangular shape as seen in a plan view. Excitation electrodes 6 to excite the thickness-shear vibration are formed on the both principal faces of the quartz crystal element 2, and an extraction electrode 6a is formed on the both sides of one end of the quartz crystal element 2 as extended therefrom. Before the encapsulation with the metallic cover 3, the both sides of the end of the quartz crystal element 2, from the end the extraction electrode 6a being extended, are fixed to the quartz crystal holding terminal 4 with a conductive adhesive 7.

In the production method of the quartz crystal resonator, by sputtering or vapor deposition in a vacuum chamber (in a vacuum atmosphere), the excitation electrode 6 and the extraction electrode 6a are formed on the quartz crystal element 2. In this case, in general, for the purpose of ensuring the adhesion strength of the excitation electrode 6, a film of Cr (chromium), Ni (nickel) or a NiCr alloy, compatible with the quartz crystal element 2 is formed as an underlayer electrode, and then the excitation electrode 6 is formed on the underlayer electrode. After the formation of the excitation electrode, the quartz crystal element 2 is taken out from the vacuum chamber, the both sides of an end of the quartz crystal element 2, from the end the extraction electrode 6a being extended, are fixed to the inner bottom face of the case body 1.

Next, the case body 1 housing the quartz crystal element 2 is again housed in the vacuum atmosphere, the excitation electrode 6a is irradiated with a gas ion, and thus the surface of the excitation electrode 6 is partially removed by abrasion to reduce the mass of the excitation electrode 6. In this way, the oscillation frequency of the quartz crystal resonator is adjusted from a lower oscillation frequency to a higher oscillation frequency. Finally, the case body is again placed back in the air atmosphere, and then, for example, in a nitrogen gas atmosphere set at normal temperature, the metallic cover 3 is joined to the opening end face to complete a quartz crystal resonator. In general, a quartz crystal resonator means a condition that the quartz crystal element 2 is hermetically encapsulated and is also referred to as a crystal unit.

In the quartz crystal resonator, as the conditions required by manufacturers and users, there are quoted a dispersion at the time of production, namely the oscillation frequency dispersion found at the time of the completion of the quartz crystal resonator, and a temporal frequency property (aging property) representing the oscillation frequency variation at the time of use with the passage of time. The dispersion at the time of production, as referred to herein is represented by ratio $\Delta f0/f0$ (ppm) of the frequency deviation $\Delta f0$ to the nominal value (the oscillation frequency demanded by users) f0 of the oscillation frequency, wherein $\Delta f0$ is the frequency deviation value from the nominal frequency. The temporal frequency property is represented by the ratio $\Delta f1/f1$ (ppm) of the frequency deviation $\Delta f1$ to the oscillation frequency f1 after the completion of the quartz crystal resonator, wherein $\Delta f1$ is the frequency deviation value from the oscillation frequency f1.

The dispersion at the time of production and the temporal frequency property are frequently dependent, in particular, on the constituent material of the excitation electrode 6 (inclusive of the extraction electrode 6a) formed on the surface of the quartz crystal element 2. In general, as the constituent material of the excitation electrode 6, Au (gold), Ag (silver) or an Au—Ag alloy is used.

Au is most preferable as the constituent material of the excitation electrode 6. Au is extremely chemically stable, and is small in the mass variation due to oxidation or sulfidation and is an electrode material satisfactory in electrical conduction property. Accordingly, even after the quartz crystal resonator is placed back in the air atmosphere subsequently to the adjustment of the frequency in the aforementioned production steps of the quartz crystal resonator, the excitation electrode 6 is hardly oxidized and the dispersion at the time of production as found at the time of completion is small. The temporal frequency property over a long period of time on a monthly or yearly basis is also satisfactory, and the oscillation frequency also exhibits an almost flat property with the passage of time.

However, Au is more expensive than other metals disadvantageously from the viewpoint of material cost. Thus, Ag or the like is applied as an alternative material for Au, but such metals do not sufficiently satisfy, in particular the dispersion at the time of production and the temporal frequency property of the quartz crystal resonator.

Specifically, for example, Ag tends to be relatively easily oxidized or sulfidized, and hence even if the Ag is pure Ag at the time of the electrode formation, the surface of the Ag is oxidized when the quartz crystal element 2 is subsequently fixed (in the air) to the case body 1. Then, further progress of the oxidation is suppressed and the Ag is chemically stabilized. However, in the frequency adjustment after the fixation operation of the quartz crystal element 2, the treatment is again performed in vacuum, and the exposed surface of the Ag formed by the abrasion becomes again a surface made of pure Ag and is activated. The exposed surface is again oxidized due to the exposure to the air after the frequency adjustment. Consequently, although the frequency adjustment has been performed, the mass of the excitation electrode is again increased due to oxidation, and the dispersion at the time of production as found in the completed quartz crystal resonator tends to occur. In such a quartz crystal resonator, oxidation or sulfidation proceeds also during use due to the effect of the organic gas component or the like discharged from the conductive adhesive 7 for fixing the quartz crystal element 2, and the oscillation frequency is decreased with the passage of time, to degrade the temporal frequency property.

Patent Literature 1 discloses an excitation electrode using a binary alloy including Ag and Pd without using Ag. However, in this case, Ag is fundamentally used as the excitation electrode, and hence there occurs a problem that the dispersion at the time of production is degraded due the mass increase ascribable to the oxidation or sulfidation of Ag in the air after the frequency adjustment.

PRIOR ART DOCUMENTS

Patent Literature

Patent Literature 1: Japanese Patent Application Laid-Open No. Hei 11-168343

SUMMARY OF THE INVENTION

Problems to be Solved by the Invention

Accordingly, an object of the present invention is to provide a resonator electrode material capable of making the dispersion at the time of production and the aging property nearly equal to or better than those of Au on the basis of the principle to make the price lower than that of Au, a piezoelectric resonator using the resonator electrode material and a sputtering target made of the resonator electrode material.

Solution to Problem

For the purpose of solving the aforementioned problem, the present inventors studied the application of an alloy mainly composed of Au as a new excitation electrode material. The adoption of Au as the main component is based on the attachment of importance to the property of Au that Au is chemically stable as described above. The adoption of Au is also based on the idea that although Au is expensive, it is possible to attain a low cost of the whole material by alloying with other metals.

In the present invention, the improvement of the dispersion at the time of production and the temporal frequency property is also a problem to be solved by the invention. In this respect, the alleviation of the dispersion ($\Delta f0/f0$) at the time of production is probably attained by applying an alloy fundamentally composed of a highly stable metal Au. On the other hand, with respect to the temporal frequency property ($\Delta f1/f1$), the present inventors studied the temporal frequency properties of various metals and have discovered that some metals exhibit a tendency to decrease the frequency and some other metals exhibit a tendency to increase the frequency. Thus, the present inventors have thought up the present invention on the assumption that by alloying metals having opposite temporal frequency properties so as for the effects of the metals to cancel each other, with Au, which is chemically stable and makes flat the temporal frequency property, a ternary alloy is obtained, and by using such a ternary alloy, the dispersion at the time of production and the temporal frequency property can be stabilized as a result of the effect of the whole alloy.

Specifically, the present invention is a resonator electrode material including a ternary alloy composed of Au and two metals M1 and M2, and being used as an excitation electrode to excite oscillation in a piezoelectric element, wherein the two metals M1 and M2 are, respectively,(a) the metal M1: a metal exhibiting a tendency to decrease the temporal frequency property of a piezoelectric resonator from the reference value f1, ($\Delta f1/f1$), and (b) the metal M2: a metal exhibiting a tendency to increase the temporal frequency property of the piezoelectric resonator from the reference value f1, ($\Delta f1/f1$). Herein, f1 is the oscillation frequency at the time of hermetically encapsulating the piezoelectric element, and $\Delta f1$ is the difference frequency between the oscillator frequency changing with the passage of time and the reference value f1.

The resonator electrode material according to the present invention maintains the chemically stable property owing to the alloying component of Au, and hence hardly undergoes changes such as oxidation. Consequently, in particular, the resonator electrode material enables to suppress the dispersion of the oscillation frequency at the time of production, as found between before and after the completion of the piezoelectric resonator sealed with the cover as placed back in the air atmosphere subsequently to the adjustment of the frequency in vacuum.

In the present invention, the metals M1 and M2 having mutually opposite effects on the temporal frequency property are alloyed with Au, which is chemically stable, so as to attain a balance between the effects of the respective metals M1 and M2, and consequently the dispersion at the time of production and the temporal frequency property are stabilized as a result of the effect of the whole alloy.

FIG. 1 presents a detailed description of the stabilization of the temporal frequency property due to the alloying of the metals M1 and M2. FIG. 1(a) shows the temporal frequency property of each of An, the metal M1 and the metal M2. FIG. 1(a) is based on the temporal frequency property data of Ag and Pd, respectively, as examples of M1 and M2 (see below-described Conventional Examples 1 to 3). Such a temporal frequency property as described above is obtained by plotting of $\Delta f1/f1$ as a function of the elapsed time, wherein the oscillation frequency of the quartz crystal resonator at the time of the completion thereof is taken as the reference value f1, and the oscillation frequency of the quartz crystal resonator measured as a function of the elapsed time is represented by f, and $\Delta f1$ is given by (f−f1), namely the deviation of f from f1. As shown in FIG. 1(a), the temporal frequency property of Au is satisfactory; the variation of $\Delta f1/f1$ is small even when the time elapses and the trajectory of this variation is almost flat.

The temporal frequency properties of the metals M1 and M2 in the present invention are such as shown in FIG. 1(a). Specifically, the metal M1 is a metal having a property such that when the metal M1 is used as the electrode, the frequency is decreased with the passage of time and $\Delta f1/f1$ is decreased (varies toward the minus direction). On the contrary, the metal M2 is a metal having a property such that when the metal M2 is used as the electrode, the frequency is increased with the passage of time and $\Delta f1/f1$ is increased (varies toward the plus direction).

The electrode material according to the present invention aims at the suppression of the temporal variation of $\Delta f1/f1$ of the whole alloy as shown in FIG. 1(b), by alloying the metals M1 and M2 having such properties as described above with Au, so as for the effects of the metals M1 and M2 to cancel each other with respect to the variation of $\Delta f1/f1$.

The reasons for the fact that the metals M1 and M2 exhibit such temporal frequency properties as described above are not necessarily wholly clear; however, on the basis of the inference of the present inventors, the metal M1 exhibiting a temporal frequency variation with a tendency to decrease is a metal relatively easily undergoing chemical reactions such as oxidation and sulfidation and the mass variation due to such reactions is interpreted to vary the temporal frequency property; and the metal M2 exhibiting a temporal frequency variation with a tendency to increase is interpreted to be a metal undergoing a variation of a mechanical property (such as hardness) with the passage of time after the production of a thin film to serve as the excitation electrode. For the metal M2, it is interpreted that the internal stress tends to be accumulated at the time of the film formation by sputtering, and the internal stress is relaxed with the passage of time and the temporal frequency property is varied.

The present inventors studied the scopes of the metals M1 and M2, in particular, preferable metals. Consequently, the present inventors have determined that the metal M1 is preferably at least any one of Ag, Al and Ni, and the metal M2 is preferably at least any one of Pd, Ru, Pt, Ir, Rh and Cu. This is because these metals have definite effects on the frequency property in the alloying with Au, and contribute to the stabilization of the frequency property through the balance attained between these metals. A particularly preferable combination of the metal M1 and the metal M2 is realized in an Au—Ag—Pd alloy in which the metal M1 is Ag and the metal M2 is Pd. It is to be noted that the metal M1 and the metal M2 may each include a plurality of the aforementioned metals.

In the resonator electrode material, as the excitation electrode material, including an Au alloy according to the present invention, the contents of the constituent metals are preferably such that the Au concentration is set at 20 to 70% by mass, and the total concentration of M1 and M2 is set at 80 to 30% by mass. For the purpose of suppressing the dispersion, at the time of production, of the oscillation frequency of the piezoelectric resonator, a certain Au concentration is required to be ensured; the Au concentration is preferably set at least 20% by mass; in consideration of the cost of the whole materials, the Au concentration is preferably a proportion of at most 70% by mass.

When the total concentration of M1 and M2 is set at 80 to 30% by mass, the mass ratio between the concentrations of M1 and M2 preferably falls within a range from 2:8 to 8:2. This is because when the effects of these two metals are excessively unbalanced, the temporal frequency property is difficult to stabilize. When the mass ratio falls more preferably within a range from 3:7 to 7:3 and furthermore preferably within a range from 4:6 to 6:4, the temporal frequency property is further stabilized. In these cases, as the Au concentration is increased, the temporal frequency property of Au becomes predominant; accordingly, the shift of the mass ratio between the metals M1 and M2 toward either the ratio 2:8 or the ratio 8:2 is allowable. In contrast to this, as the Au concentration is decreased, the total concentration of the metals M1 and M2 is increased, and the temporal frequency property due to the metals M1 and M2 becomes predominant. Consequently, in this case, under the conditions that the weight ratio between the metals M1 and M2 is made as even as possible so as to fall within a range from 4:6 to 6:4, the monotonic decrease with time due to the metal M1 and the monotonic increase with time due to the metal M2 in the temporal frequency property are required to cancel each other.

As can be seen from the graph of FIG. 1(a), the temporal frequency property of Au is approximately flat, but when examined closely, exhibits a decreasing tendency after the elapsed time of 100 hours or more so as to monotonically decrease with time. Accordingly, by controlling the mass ratio between the metals M1 and M2, a temporal frequency property exhibiting a monotonic increase with time is formed as the temporal frequency property of the set of the metals M1 and M2 so as to be larger than the reference value, and by canceling the temporal frequency property of Au exhibiting a monotonic decrease with time by the temporal frequency property of the set of the metals M1 and M2, a temporal frequency property better than the temporal frequency property of Au as a simple substance can also be obtained.

The resonator electrode material as the excitation electrode including a ternary alloy (Au, Ag, Pd) is not explicitly described with respect to the impurities included in the course of the production steps; however, actually, the contamination of such impurities is inevitable; thus, even if the contamination of the impurities occurs, the impurities are not excluded within the inevitable ranges thereof. For example, as a guideline, when the total content of the impurities (oxygen, carbon and sulfur) is 150 ppm or less, no particular problem is caused. The total content of the impurities is preferably set at 100 ppm or less. In particular, unpreferably the contamination of O (oxygen) or S (sulfur) causes the oxidation or sulfidation of Ag, Pd and the like in the electrode film to unstabilize the temporal frequency property. Unpreferably, the contamination of C (carbon) increases the resistance of the electrode.

In the piezoelectric resonator provided with the piezoelectric element having as formed thereon an electrode including the aforementioned resonator electrode material according to the present invention, the dispersion of the oscillation frequency at the time of production as found at the time of completion is small, and the temporal frequency property can be maintained over a long period of time even at the use stage. The present invention is useful, in particular as the quartz crystal resonator using a quartz crystal element as the piezoelectric element and is useful for the quartz crystal resonator in which the excitation electrode is formed on the surface of the quartz crystal element.

In the embodiments, the quartz crystal resonator is described as a surface mounting type; however, the present invention is not limited to this type, but can also be applied to a leadtype in which as a metal base, a lead wire is extended; to sum up, the present invention can be applied to a piezoelectric resonator having an excitation electrode to excite oscillation in the piezoelectric element such as a quartz crystal element; examples of the application of the present invention also include an IDT electrode to excite surface acoustic wave.

For the purpose of forming as an electrode the resonator electrode material according to the present invention, a thin film formation method such as a vacuum vapor deposition can be applied; however, a sputtering method is preferable for the purpose of efficient production of products.

The resonator electrode material according to the present invention is also suitably compatible with sputtering. This is because the sputter rates of Ag (sputter rate: 2.20), Cu (sputter rate: 1.59) and Pd (sputter rate: 1.41) are close to the sputter rate f Au (sputter rate: 1.65), and hence a thin film having a composition free from deviation from the target composition can be formed. Consequently, a target made of the aforementioned Au alloy can be applied as a sputtering target for forming an electrode.

The impurity concentrations in the target are preferably reduced. The impurities in the target offer causes for the impurities in the produced thin film (electrode), and possibly may impair the property of the produced thin film. Examples of the impurities possibly included in the target include O, C and S; the total of the contents of these impurities is preferably 150 ppm or less and is more preferably set at 100 ppm or less. In particular, unpreferably the contamination of O or S results in the oxidation or sulfidation of Ag, Pd and the like in the electrode film to unstabilize the temporal frequency property. Unpreferably, the contamination of C increases the resistance of the electrode.

More preferably, among the individual impurity contents, at least any one (preferably all) of the oxygen content, the carbon content and the sulfur content is 80 ppm or less.

Moreover, for the purpose of forming an electrode having a more uniform composition, the target is also preferably uniform. In this respect, although the target is also an alloy metal having a polycrystalline structure, the target preferably has a structure having an average crystal grain boundary of 50 to 200 μm. This is because when the average crystal grain boundary is less than 50 μm, particles tend to occur during sputtering, and when the average crystal grain boundary is larger than 200 μm, segregation tends to occur, and thus the alloy composition in the electrode film is dispersed. The segregation in the grain boundary is not preferable, and hence, in both of the composition in the grain boundary and the average composition of the whole alloy, the Au concentration preferably falls within a range from 0.05% by mass to 1.0% by mass.

The sputtering target according to the present invention can also be produced by using the powder metallurgy method in addition to the melt casting method as the method for producing the sputtering target.

Advantageous Effects of the Invention

As described above, according to the electrode material according to the present invention, not by using Au as a simple substance, but by using a ternary alloy including Au, the dispersion of the piezoelectric resonator at the time of production can be suppressed, and at the same time, the temporal frequency property can be made satisfactory so as to be approximately equal to or better than the temporal frequency property due to Au. Additionally, as compared to the conventional electrode materials made of Au, the electrode material according to the present invention reduces the used amount of Au by alloying and thus can also contribute to the reduction of the material cost.

DETAILED DESCRIPTION OF THE PREFERRED EMBODIMENT

Figure 1:
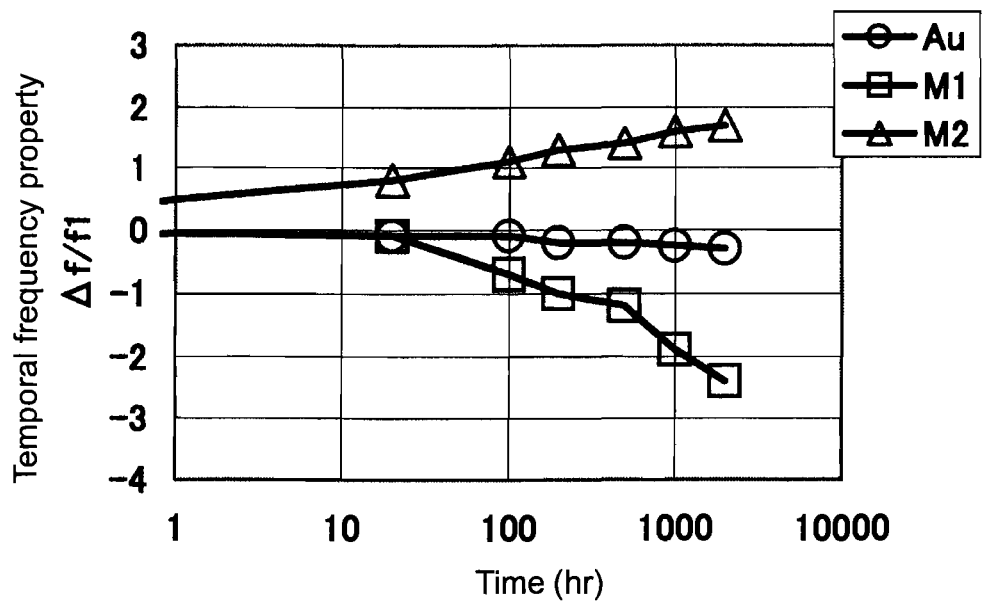
FIG. 1 shows the graphs schematically illustrating the temporal frequency properties of Au and the metals M1 and M2 and the alloy according to the present invention.
Figure 1:
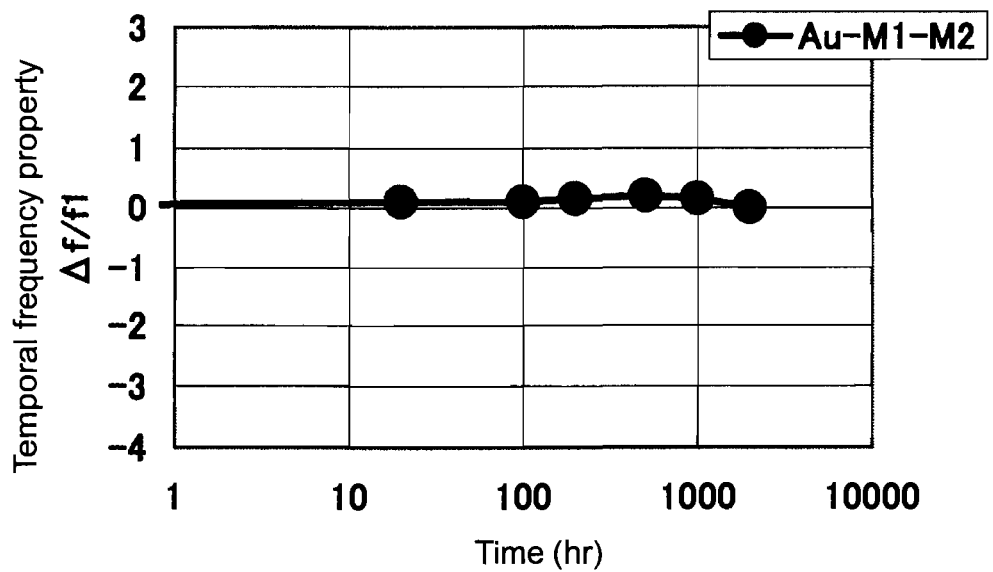

Hereinafter, the embodiment of the present invention is described. In the present embodiment, sputtering targets made of Au ternary alloys having various compositions were produced, and quartz crystal resonators were produced on the basis of these sputtering targets. For comparison, Au binary alloys were also studied similarly.

Production of Alloy Targets:

Au alloy targets were each produced with the following method. An Au ingot, an Ag ingot and a Pd ingot were weighed out so as to satisfy the predetermined mass ratio, and were placed in an alumina crucible. These ingots were melted in the air under stirring in a high-frequency melting furnace, and then the resulting molten mixture was poured into a rectangular casting mold to produce an alloy ingot. The alloy ingot was repeatedly rolled and heat treated into a 30-mm thick plate material. The rolling and heat treatment were performed by controlling the workpiece in such a way that the crystal grain size became 50 μm or more and 200 μm or less. A disk-shaped plate was cut out from the resulting plate material to produce an Au alloy target. The types and the impurity contents of the Au alloy targets produced in the present embodiment are as shown in Table 1. The average values of the crystal grain size are also shown in Table 1.

For each of the targets after production, the O concentration was measured by using an oxygen and nitrogen analyzer (LECO TC-600) with infrared absorption method, and the C and S concentrations were measured by using a carbon and sulfur analyzer (Horiba, EMIA-920V) with infrared absorption method. The average value of the crystal grain size was obtained as follows: parallel straight lines were randomly drawn on a metallographic photograph at a magnification of 140, the lengths of all the segments of the straight lines overlapping with the alloy phases were measured, and the average value of the measured lengths was calculated as the average value of the crystal grain boundaries. The number of the parallel straight lines drawn on the metallographic photograph was set so as for the segments overlapping with the alloy phases to be 200 or more.

TABLE 1

| | Composition | Crystal grain boundary (μm) | Impurity concentrations (ppm) | | |
|---|---|---|---|---|---|
| | | | O | C | S |
| Example 1 | Au—20% Ag—30% Pd | 153 | 73 | 15 | Less than 10 |
| Example 2 | Au—30% Ag—20% Pd | 123 | 60 | 16 | Less than 10 |
| Example 3 | Au—30% Ag—30% Pd | 145 | 69 | 13 | Less than 10 |
| Example 4 | Au—20% Ag—20% Pd | 162 | 65 | 15 | Less than 10 |

TABLE 1-continued

| | Composition | Crystal grain boundary (μm) | Impurity concentrations (ppm) | | |
|---|---|---|---|---|---|
| | | | O | C | S |
| Example 5 | Au—40% Ag—20% Pd | 152 | 62 | 19 | Less than 10 |
| Example 6 | Au—50% Ag—20% Pd | 164 | 65 | 17 | Less than 10 |
| Example 7 | Au—50% Ag—30% Pd | 150 | 70 | 15 | Less than 10 |
| Comparative Example 1 | Au—60% Ag—30% Pd | 165 | 68 | 17 | Less than 10 |
| Reference Example 1 | Au—20% Ag | 156 | 14 | 32 | Less than 10 |
| Reference Example 2 | Au—40% Ag | 145 | 18 | 45 | Less than 10 |
| Conventional Example 1 | Pure Au | 331 | 12 | 8 | Less than 10 |
| Conventional Example 2 | Pure Ag | 235 | 6 | 65 | Less than 10 |
| Conventional Example 3 | Pure Pd | 250 | 123 | 5 | Less than 10 |

Figure 4:
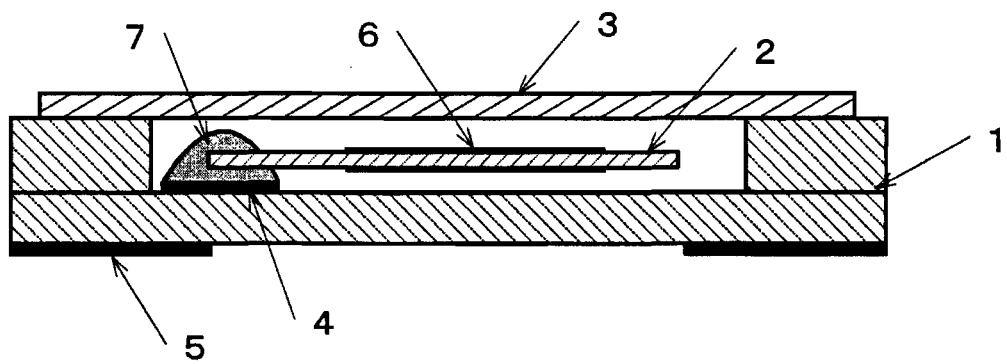
FIG. 4 presents diagrams illustrating the configuration of a surface mounting-type quartz crystal resonator.
Figure 4:
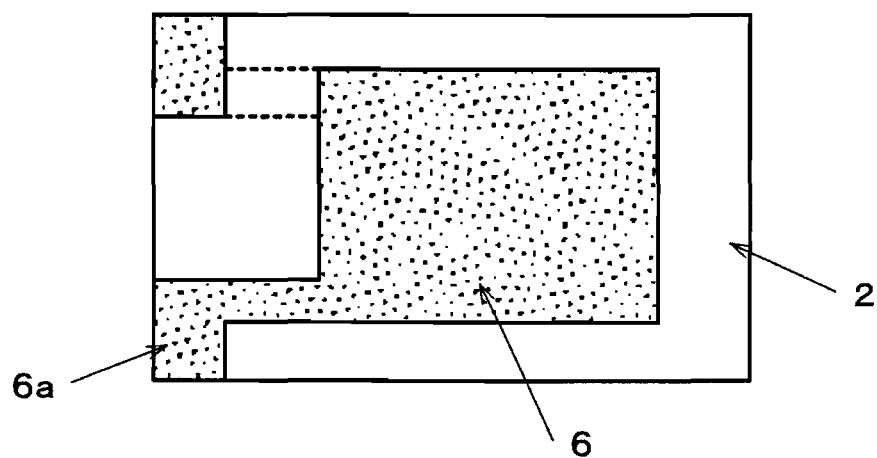

Production of Quartz Crystal Resonators:

The quartz crystal resonators produced herein are the same surface mounting-type quartz crystal resonators as shown in FIG. 4. A quartz wafer cut out from an artificial quartz by the AT cutting was further subjected to grinding and cutting processing and divided into rectangular elements. Then, with the sputtering method using the aforementioned different targets, an excitation electrode 6 and an extraction electrode 6a were formed respectively on the both principal faces of each of the quartz crystal elements. Before the formation of the electrodes made of the Au alloys, Cr (chromium) films were formed by sputtering as underlayer electrodes on each of the quartz crystal elements. The underlayer electrode is compatible with the quartz crystal element and ensures the adhesion strength of the Au alloy formed thereon. In this case, the thickness of the underlayer electrode was set at 50 Å. In general, the thickness of the excitation electrode 6 is smaller as the oscillation frequency is higher; in this example, the oscillation frequency was assumed to be 26 MHz and the thickness of the excitation electrode 6 was set at 1600 Å in terms of Au.

The excitation electrodes 6 are required to have the same mass when the oscillation frequencies thereof are the same (the thickness values of the quartz crystal elements are the same) irrespective of the types of the materials thereof. Accordingly, the thickness of the excitation electrode 6 varies depending on the specific gravity of the electrode material used. Therefore, when any type of electrode material is used, the thickness of the excitation electrode 6 is represented in terms of the thickness of the Au electrode, which is generally used, so as to facilitate the comparison. For example, the aforementioned thickness of 1600 Å in terms of Au corresponds to a thickness of 3000 Å in terms of Ag.

After the formation of the aforementioned excitation electrode 6, the both sides of the end of the quartz crystal element 2, from which the extraction electrode 6a was extended, was fixed with a conductive adhesive 7 to the quartz crystal holding terminal 4 disposed on the inner bottom face of the case body 1. Then, the case body 1 with the quartz element 2 fixed therein was introduced into a vacuum chamber, the excitation electrode 6 was irradiated with gas ion, and thus the surface thereof is partially removed by abrasion to adjust the oscillation frequency. The adjusted frequency was set at the aforementioned value of 26 MHz. After the adjustment of the oscillation frequency, the metallic cover 3 was joined to the opening end face of the case body 1 to complete a quartz crystal resonator. The plane external shape of the case body 1 was 3.2×2.5 mm, and the plane external shape of the quartz crystal element was 2.1×1.4 mm.

Evaluation of Properties of Quartz Crystal Resonators:

For each of the quartz crystal resonators produced as described above, the evaluation of the dispersion at the time of production and the temporal frequency property was performed. First, evaluated was the dispersion at the time of production as found at the time of completion of the quartz crystal resonator in which the quartz crystal element 2 was hermetically encapsulated. In this evaluation, for each of the quartz crystal resonators (100 oscillators) after production, the initial oscillation frequency f1 was measured, the frequency deviation of the initial oscillation frequency f1 in relation to the nominal frequency f0, $\Delta f0/f0$ (where $\Delta f0=f1-f0$) was calculated. The thus obtained $\Delta f0/f0$ values were statistically treated. The results thus obtained are shown in FIG. 2.

Figure 2:
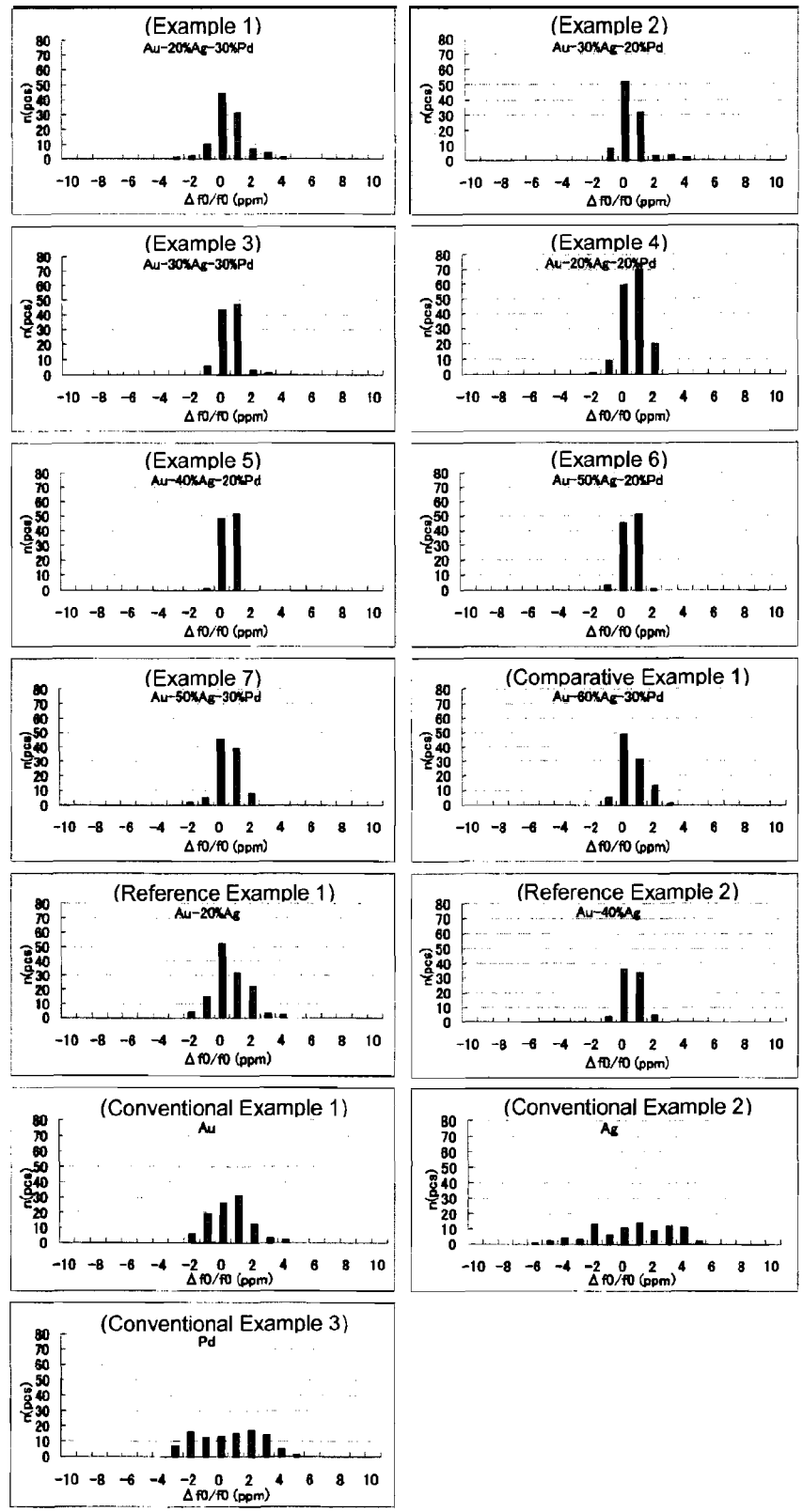
FIG. 2 presents the graphs showing the dispersions at the time of production of the quartz crystal resonators according to Examples, Comparative Example, Reference Examples and Conventional Examples represented by the distribution of the frequency deviation of the initial frequency f1 in relation to the nominal frequency f0, $\Delta f0/f0$.

As can be seen from FIG. 2, a quartz crystal resonator having an excitation electrode 6 made of Au, namely a conventional quartz crystal resonator, exhibited a converged frequency deviation $\Delta f0/f0$, and can be said that the dispersion at the time of production was small and is a satisfactory product (Conventional Example 1). The quartz crystal resonators each including an excitation electrode 6 made of a ternary Au alloy have the properties approximately equivalent to the properties of the quartz crystal resonator including the excitation electrode made of Au (Examples 1 to 7 and Comparative Example 1). In contrast to this, the quartz crystal resonator including the excitation electrode 6 made of Ag exhibited a dispersion of the frequency deviation $\Delta f0/f0$ and it can be seen that the dispersion at the time of production was large (Conventional Example 2). When Pd was used, the variation width (dispersion) was smaller than when Ag was used, to result in a graph showing a variation width approaching the variation width observed with Au (Conventional Example 3). This is ascribable to the fact that Pd is a chemically stable material next to Au. From the viewpoint of the evaluation of the dispersion at the time of production ($\Delta f0/f0$), it can be said that the use of a material chemically more stable than Ag results in satisfactory results, and in particular, the use of Au-containing binary alloys also results in satisfactory results (Reference Examples 1 and 2).

Figures 1, 3:
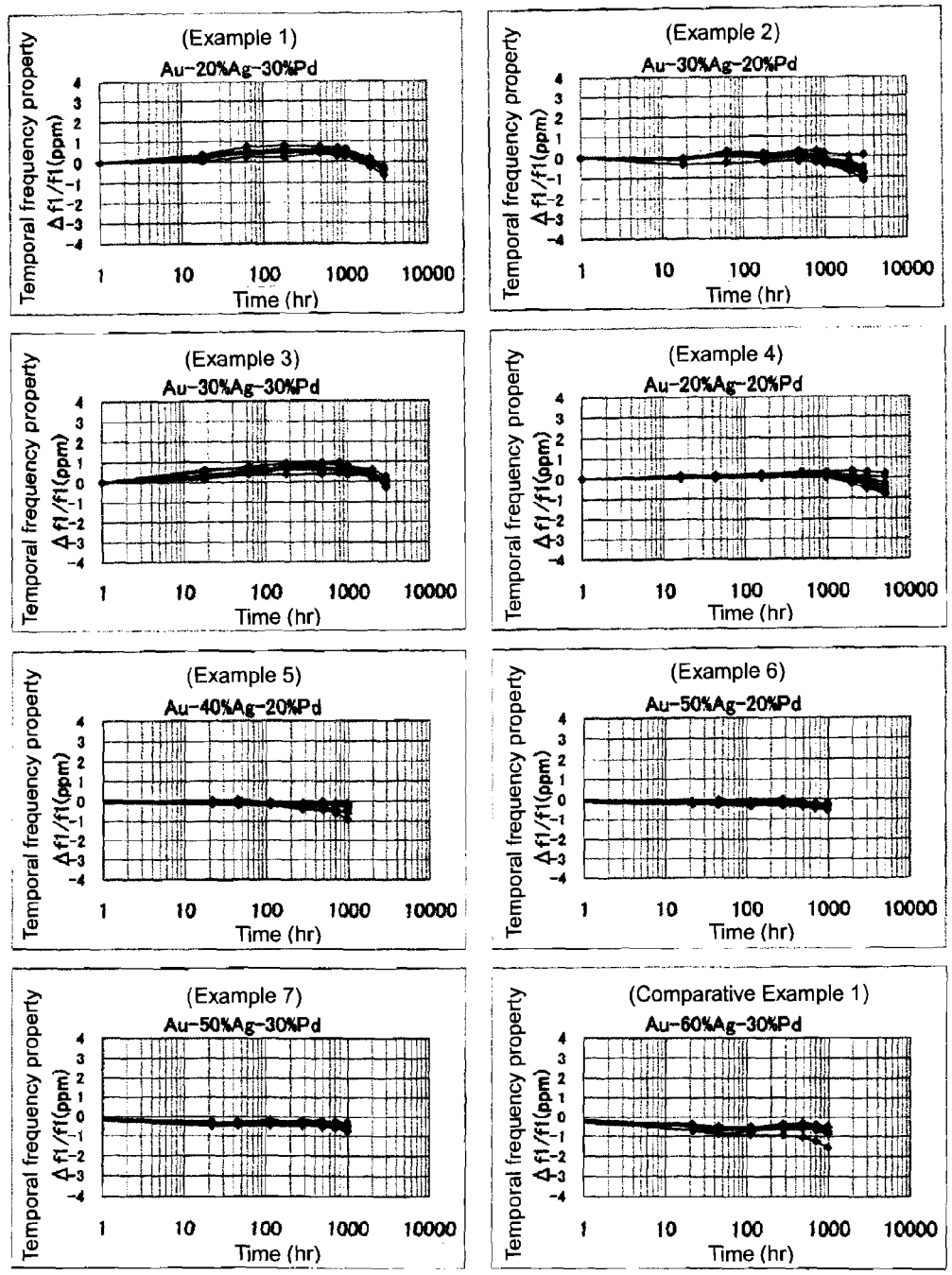
FIG. 3 presents the graphs showing the temporal frequency properties of the quartz crystal resonators according to Examples, Comparative Example, Reference Examples and Conventional Examples represented by the frequency deviation in relation to the initial oscillation frequency f1, $\Delta f1/f1$.
Figures 2, 3:
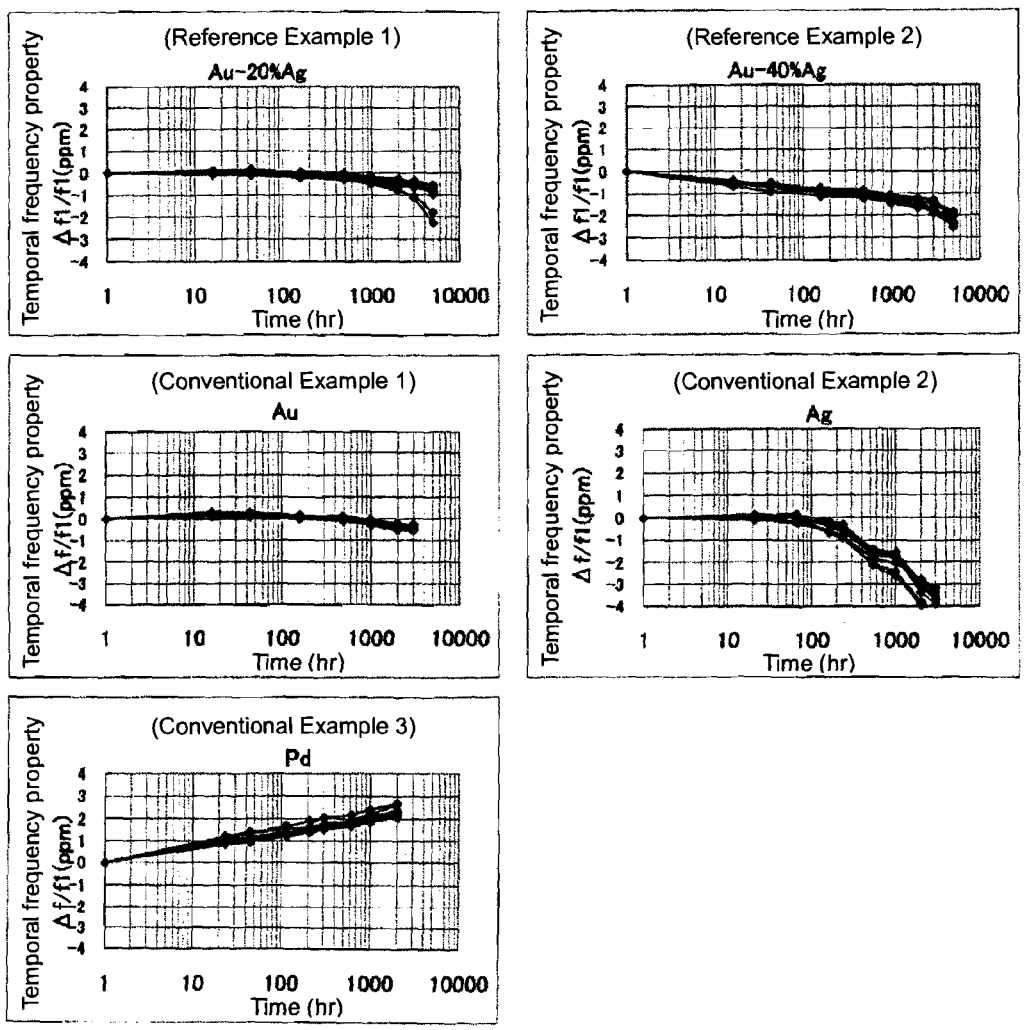

Next, the evaluation of the temporal frequency property was performed. In the examination for the evaluation, each of the quartz crystal resonators was placed in a thermostatic chamber set at a predetermined temperature, the frequency f thereof was measured at the elapsed times of 10, 100, 500, 1000, 2000 and 3000 hours, and thus the temporal frequency property was evaluated. The values of the frequency deviation of the frequency f in relation to the initial oscillation frequency f1 at the time of completion when the quartz crystal element 2 was hermetically encapsulated, $(\Delta f1/f1)(ppm)=(f-f1)/f1\times 1{,}000{,}000$, were calculated. The number of the quartz crystal resonator samples was 10 for each of Examples, Comparative Example, Reference Examples and Conventional Examples. Here, the temperature of the thermostatic chamber was set at 85° C. It is to be noted that the oscillation frequencies at the elapsed times of 1000, 2000 and 3000 hours at the test temperature of 85° C. approximately correspond to the oscillation frequencies at the elapsed times of 2, 4 and 6 years, respectively. The results thus obtained are shown in FIG. 3.

In the evaluation of the temporal frequency property of the electrode material, under the assumed acceptance condition that the frequency deviation $\Delta f1/f1$ at 85° C. at the elapsed time of 1000 hours falls within a range of ±2 ppm, Au exhibited a small frequency deviation Δf1/f1 in terms of the Δf1/f1 value at 85° C., even at long elapsed times, and hence the stability of the temporal frequency property of Au was verified (Conventional Example 1). In contrast to this, in the case of Ag, the frequency exhibited a tendency to decrease as a whole, and some samples exhibited the frequency deviations lower than −2 ppm before the elapsed time of 1000 hours (Conventional Example 2). In the case of Pd, the frequency exhibited a tendency to increase as a whole, and some samples exhibited the frequency deviations higher than 2 ppm before the elapsed time of 1000 hours (Conventional Example 3). It is to be noted that in the case of Pd, when the test time exceeded 1000 hours and for example, a test time of 5000 hours passed, the downward variation of the frequency deviation occurred. However, even when the downward variation of the frequency deviation occurred, also since then the frequency deviation still stayed in the plus region over a long period of time.

On the one hand, for these metals, the aforementioned results were obtained, and on the other hand, for the ternary Au alloys, the temporal frequency property stabilities approximately equivalent to or higher than that for Au were exhibited (Examples 1 to 7 and Comparative Example 1).

However, when the composition was Au-60% Ag-30% Pd (Comparative Example 1), although the acceptance condition was satisfied, the dispersion among the frequency deviations of the individual quartz crystal resonators (10 oscillators) after the elapsed time of 1000 hours became large. In other words, as compared to other Examples 1 to 7 in which the mass ratio of Au was set at 20% or more, for example, by adopting the composition of Au-50% Ag-30% Pd (Example 7), the frequency deviations after the elapsed time of 1000 hours became larger. For this dispersion after the elapsed time of 1000 hours, the composition such that the Ag concentration was as high as 60% by mass and the Au concentration was as low as 10% by mass is interpreted as one of the involved factors. Accordingly, for the purpose of suppressing the dispersion of the frequency deviation, the Au concentration in the Au alloy is required to ensure at least 20% by mass. In this case, in consideration of the resistance value of the whole alloy (crystal impedance), the Pd concentration is specified to be within 30% by mass, and hence the Ag concentration is at most 50% by mass. Consequently, the temporal frequency property is allowed to fall within a range of ±2 ppm and the dispersion at the elapsed time of 1000 hours is also suppressed, and hence the reliability is also enhanced.

As compared to Ag, the binary Au alloys are considered to be effective to some extent (Reference Examples 1 and 2 and Conventional Example 2). However, with reference to the measurement results at long elapsed times, the effects of the binary Au alloys can be said lower as compared to the effects of the ternary alloys. Additionally, with the increase of the addition amount of Ag, the effect of varying the frequency deviation toward the minus direction becomes larger and it becomes difficult to maintain the stability of the temporal frequency property. Consequently, from the viewpoint of the purpose of maintaining the performance of the Au alloy while the Au content in the Au alloy is being decreased, the binary Au alloys are not promising.

Figure 5:
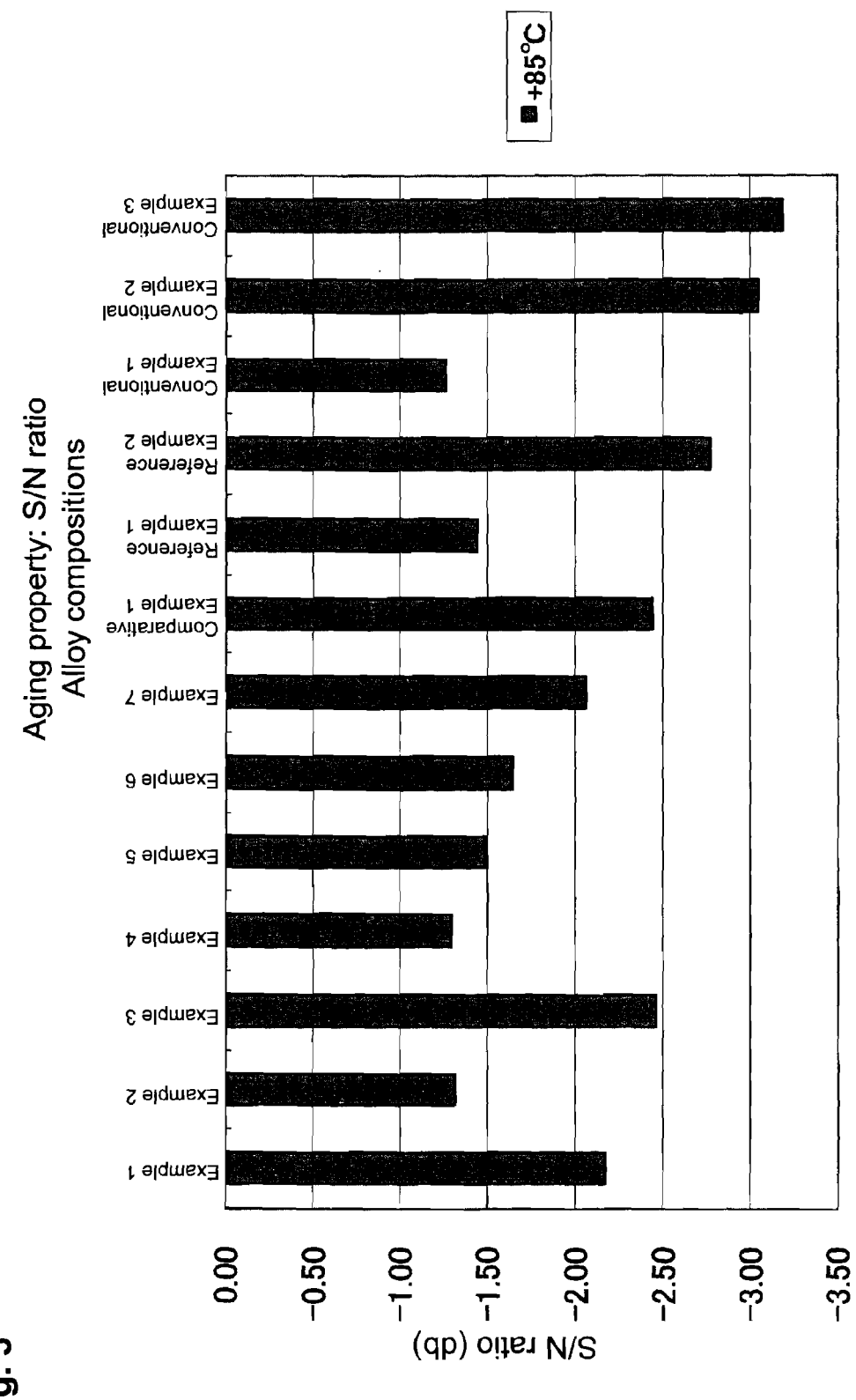
FIG. 5 is a graph showing the nominal-the-best characteristics of Examples, Comparative Example, Reference Examples and Conventional Examples.

FIG. 5 shows the stabilities after aging of Examples, Comparative Example, Reference Examples and Conventional Examples. The results shown in FIG. 5 were obtained by calculating the zero nominal-the-best SN ratios from the Δf values for the evaluation of the temporal frequency property over a period of 1000 hours; it can be said that the larger the SN ratio is, the more stable the performance is.

Hereinafter, the calculation method of the zero nominal-the-best SN ratio is described. The oscillation frequency variation $\Delta f_t = (f_t - f_1)$ (Hz) of each of quartz crystal resonators (10 oscillators) exposed to a temperature of 85° C. was measured over a period of 1000 hours. Here, $f_t$ is the oscillation frequency at an elapsed time of t hours and $f_1$ is the initial oscillation frequency (before aging (the oscillation frequency at an elapsed time of 0 hour)). Because it is desirable that the $\Delta f_t$ value should be invariant, the SN ratio, $\eta X$, was calculated as the zero nominal-the-best characteristic, for each of the 10 oscillators.

The evaluation was performed by using the 10 sample quartz crystal resonators; the elapsed time, namely, the time during which each of the sample oscillators was allowed to be exposed to the temperature of 85° C. was specified to be 0 h, 50 h, 100 h, 200 h, 400 h, 700 h and 1000 h; thus 60 values of $\Delta f_t$ were measured. The $\Delta f_t$ values at these elapsed times except for the 0 h are represented by $\Delta f_{50}$, $\Delta f_{100}$, $\Delta f_{200}$, $\Delta f_{400}$, $\Delta f_{700}$ and $\Delta f_{1000}$, respectively, $\sigma^2$ is defined by $\sigma^2 = ((\Delta f_{50})^2 + (\Delta f_{100})^2 + (\Delta f_{200})^2 + (\Delta f_{400})^2 + (\Delta f_{700})^2 + (\Delta f_{1000})^2)/60$, and the SN ratio is calculated from $\sigma^2$ with the formula $\eta X = -\log(\sigma^2)$ (db).

As can be seen from FIG. 5, similarly to Au, the performances of the ternary Au alloys are more stable than the performances of Ag and Pd. The obtained results show that when the Au concentration is low, the performances of the alloys in which the mass proportion of Ag is higher than the mass proportion of Pd are stable (Examples 1 to 3, and 5).

From the above-described test results, with respect to the dispersion at the time of production and the aging property at the time of use, the ternary Au alloys shown in Examples are approximately equivalent to or higher than Au, and are all satisfactory (Examples 1 to 7). Also, in these alloys, the effects of the individual temporal frequency properties of Ag and Pd on the aging property (SN ratio) of each of the Au alloys were found to exhibit a tendency to vary according to the Au concentration.

The tendency, as referred to above, is the fact that, for example, when the Au concentration in the alloy is high, the tendency of Pd to increase the temporal frequency property and the tendency of Ag to decrease the temporal frequency property affect the Au alloy in an approximately equal manner. Such a tendency is clearly manifested by the fact that in the case of the Au alloy having an Au concentration of 60% by mass and a mass ratio between the Ag and Pd concentrations of 5:5, the SN ratio of this alloy is equivalent to the SN ratio of Au (Example 4 and Conventional Example 1 in FIG. 5); as a result of the balance between the increasing and decreasing tendencies of Ag and Pd, the aging effect as stable as in Au has been manifested.

However, it is also certain that when the Au concentration is high, the effect of the flatness of the temporal frequency property of Au itself significantly affects the property of the Au alloy. Therefore, such a high Au concentration stabilizes the temporal frequency property of the Au alloy itself even when the mass ratio between Ag and Pd is somewhat varied. As revealed by the subsequent additional tests, in the case where the Au concentration is high so as to fall within a range of 50% by mass or higher and 70% by mass or lower, when the mass ratio between the Ag and Pd concentrations in the Au alloy is set to fall within a range from 8:2 to 2:8, no problem occurs in the aging property of the Au alloy. When such a mass ratio is set to fall within a range more preferably from 7:3 to 3:7 and furthermore preferably from 6:4 to 4:6, the aging property of the Au alloy is further stabilized.

On the other hand, in the case where the Au concentration is low, when the addition amount of Ag is larger than the addition amount of Pd, the aging property exhibits a tendency to be stabilized. This tendency is also manifested by the fact that in the case where the Au concentration is 50% by mass or 40% by mass, when the addition amount of Ag is larger than the addition amount of Pd, the aging property (SN ratio) is stabilized (Examples 1 and 2 and Examples 3 and 5 in FIG. 5). As revealed by the subsequent additional tests, in the case where the Au concentration is somewhat low so as to fall within a range from 20% by mass to 50% by mass, when the mass ratio between the Ag and Pd concentrations in the Au alloy is set to fall within a range from 8:2 to 4:6, no problem occurs in the aging property. When such a mass ratio is set to fall within a range more preferably from 8:2 to 5:5 and furthermore preferably from 8:2 to 6:4, the aging property is further stabilized.

Table 2 shows the measurement results of the average particle sizes of the excitation electrode films of Examples, Comparative Example, Reference Examples and Conventional Examples. The measurement was performed with a scanning probe microscope (Innova, manufactured by Veeco Instruments, Inc.) by scanning a surface area of 1 µm×1 µm. Following the scanning, the surface profile was displayed with the aid of an analysis software (SPM Lab Analysis V7.00), and 20 particles in the screen were randomly sampled. The diameters of the sampled particles were determined on the screen, and the average value of these diameters was defined as the average particle size. As can be seen from Table 2, the average particle size of the excitation electrode film is smaller in each of the ternary Au alloys than in Au and the binary Au—Ag alloys.

TABLE 2

|  | Composition | Average particle size (nm) |
|---|---|---|
| Example 1 | Au—20% Ag—30% Pd | 50 |
| Example 2 | Au—30% Ag—20% Pd | 65 |
| Example 3 | Au—30% Ag—30% Pd | 50 |
| Example 4 | Au—20% Ag—20% Pd | 45 |
| Example 5 | Au—40% Ag—20% Pd | 75 |
| Example 6 | Au—50% Ag—20% Pd | 75 |
| Example 7 | Au—50% Ag—30% Pd | 65 |
| Comparative Example 1 | Au—60% Ag—30% Pd | 65 |
| Reference Example 1 | Au—20% Ag | 110 |
| Reference Example 2 | Au—40% Ag | 140 |
| Conventional Example 1 | Pure Au | 160 |
| Conventional Example 2 | Pure Ag | 150 |
| Conventional Example 3 | Pure Pd | 60 |

INDUSTRIAL APPLICABILITY

The present invention is useful as an electrode material for a piezoelectric resonator, and can be applied to a piezoelectric resonator small in the dispersion of the oscillation frequency at the time of production as found at the time of completion and capable of maintaining the temporal frequency property over a long period of time even at the use stage. The present invention can also contribute to the material cost reduction.

REFERENCE SIGNS LIST

1 Case body
2 Quartz crystal element
3 Cover
4 Quartz crystal holding terminal
5 Mounting terminal
6 Excitation electrode
7 Conductive adhesive

What is claimed is:

1. A resonator electrode material comprising a ternary alloy composed of Au and two metals M1 and M2, for an excitation electrode to excite oscillation in a piezoelectric element, wherein the metal M1 is Ag; and the metal M2 is at least any one of Pd, Ru, Pt, Ir, Rh and Cu; and further, the Au concentration is 20 to 70% by mass and the total concentration of M1 and M2 is 80 to 30% by mass.

2. The resonator electrode material according to claim 1, wherein the metal M2 is Pd.

3. The resonator electrode material according to claim 1, wherein the mass ratio between the M1 concentration and the M2 concentration falls within a range from 2:8 to 8:2.

4. A piezoelectric resonator comprising a piezoelectric element having as formed thereon an excitation electrode comprising the resonator electrode material according to claim 1.

5. The piezoelectric resonator according to claim 4, wherein the piezoelectric element is a quartz crystal element and the excitation electrode is formed on a surface underlayer electrode of the quartz crystal element.

6. A sputtering target comprising the resonator electrode material according to claim 1, wherein the sputtering target is an Au alloy sputtering target and the total of the contents of O, C and S as impurities is 150 ppm or less.

7. The sputtering target according to claim 6, wherein the sputtering target has a structure having an average grain size of 50 to 200 µm.

8. The resonator electrode material according to claim 2, wherein the mass ratio between the M1 concentration and the M2 concentration falls within a range from 2:8 to 8:2.

9. A piezoelectric resonator comprising a piezoelectric element having as formed thereon an excitation electrode comprising the resonator electrode material according to claim 2.

10. A piezoelectric resonator comprising a piezoelectric element having as formed thereon an excitation electrode comprising the resonator electrode material according to claim 3.

11. A piezoelectric resonator comprising a piezoelectric element having as formed thereon an excitation electrode comprising the resonator electrode material according to claim 8.

12. The piezoelectric resonator according to claim 9, wherein the piezoelectric element is a quartz crystal element and the excitation electrode is formed on a surface underlayer electrode of the quartz crystal element.

13. The piezoelectric resonator according to claim 10, wherein the piezoelectric element is a quartz crystal element and the excitation electrode is formed on a surface underlayer electrode of the quartz crystal element.

14. The piezoelectric resonator according to claim 11, wherein the piezoelectric element is a quartz crystal element and the excitation electrode is formed on a surface underlayer electrode of the quartz crystal element.

15. A sputtering target comprising the resonator electrode material according to claim 2, wherein the sputtering target is an Au alloy sputtering target and the total of the contents of O, C and S as impurities is 150 ppm or less.

16. A sputtering target comprising the resonator electrode material according to claim 3, wherein the sputtering target is an Au alloy sputtering target and the total of the contents of O, C and S as impurities is 150 ppm or less.

17. A sputtering target comprising the resonator electrode material according to claim 8, wherein the sputtering target is an Au alloy sputtering target and the total of the contents of O, C and S as impurities is 150 ppm or less.

18. The sputtering target according to claim 15, wherein the sputtering target has a structure having an average grain size of 50 to 200 μm.

* * * * *